(12) United States Patent
Melanson

(10) Patent No.: US 10,945,074 B2
(45) Date of Patent: Mar. 9, 2021

(54) LOW-LATENCY COMPENSATING AUDIO FILTERS USING NEGATIVE GROUP DELAY

(71) Applicant: Cirrus Logic International Semiconductor Ltd., Edinburgh (GB)

(72) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/522,406

(22) Filed: Jul. 25, 2019

(65) Prior Publication Data

US 2020/0389726 A1 Dec. 10, 2020

Related U.S. Application Data

(60) Provisional application No. 62/858,667, filed on Jun. 7, 2019, provisional application No. 62/870,152, filed on Jul. 3, 2019.

(51) Int. Cl.
| | | |
|---|---|---|
| *H04B 15/00* | (2006.01) | |
| *H04R 3/04* | (2006.01) | |
| *G10L 21/0232* | (2013.01) | |
| *H03F 3/181* | (2006.01) | |

(52) U.S. Cl.
CPC ............ *H04R 3/04* (2013.01); *G10L 21/0232* (2013.01); *H03F 3/181* (2013.01); *H03F 2200/03* (2013.01); *H03F 2200/165* (2013.01)

(58) Field of Classification Search
CPC .................................................... H04B 15/00
See application file for complete search history.

(56) References Cited

U.S. PATENT DOCUMENTS

| | | | |
|---|---|---|---|
| 5,157,395 A | 10/1992 | Del Signore | |
| 6,256,395 B1 * | 7/2001 | Melanson | H04R 25/505 381/312 |
| 6,340,940 B1 * | 1/2002 | Melanson | H03M 3/392 341/143 |
| 6,724,332 B1 * | 4/2004 | Melanson | H03M 7/3011 341/143 |
| 7,174,229 B1 | 2/2007 | Chen et al. | |
| 7,358,881 B2 * | 4/2008 | Melanson | H03M 7/3035 341/143 |
| 7,365,669 B1 * | 4/2008 | Melanson | G10K 11/17819 341/143 |
| 7,825,845 B1 * | 11/2010 | Melanson | G01R 33/07 341/155 |
| 8,750,441 B2 * | 6/2014 | Zuckerman | H03L 7/185 375/349 |
| 9,565,306 B2 | 2/2017 | Zhang et al. | |
| 10,186,249 B1 * | 1/2019 | Lan | G10K 11/178 |

(Continued)

OTHER PUBLICATIONS

Redmon, Nigel, Oversampling | Ear Level Engineering, posted Oct. 19, 1996, https://www.earlevel.com/main/1996/10/19/oversampling/.

*Primary Examiner* — Olisa Anwah
(74) *Attorney, Agent, or Firm* — Jackson Walker L.L.P.

(57) ABSTRACT

A system may include an input configured to receive an audio signal, a filter having a negative group delay within a range of frequencies which are human-audible, the filter configured to receive the audio signal and filter the audio signal to generate a filtered audio signal, and a modulator configured to receive the filtered audio signal and modulate the filtered audio signal to generate a modulated filtered audio signal for communication over a digital interface.

24 Claims, 5 Drawing Sheets

(56) References Cited

U.S. PATENT DOCUMENTS

| | | | |
|---|---|---|---|
| 10,701,486 B1 | 6/2020 | Melanson et al. | |
| 10,726,873 B2 | 7/2020 | He et al. | |
| 10,764,681 B1 | 9/2020 | Melanson | |
| 2007/0146185 A1 | 6/2007 | Kang et al. | |
| 2011/0134980 A1 | 6/2011 | Lipka et al. | |
| 2014/0301571 A1* | 10/2014 | Melanson | H03M 3/00 381/111 |
| 2014/0307786 A1 | 10/2014 | Deng et al. | |
| 2015/0140972 A1 | 5/2015 | Zhang et al. | |
| 2016/0314805 A1 | 10/2016 | Mortazavi et al. | |
| 2017/0110141 A1 | 4/2017 | Craven et al. | |
| 2017/0300290 A1* | 10/2017 | Hester | G11B 27/038 |
| 2018/0124529 A1 | 5/2018 | Larsen et al. | |
| 2019/0123753 A1* | 4/2019 | Straeussnigg | H03M 1/1245 |
| 2019/0199559 A1 | 6/2019 | Wang et al. | |

\* cited by examiner

LOW-LATENCY COMPENSATING AUDIO FILTERS USING NEGATIVE GROUP DELAY

RELATED APPLICATIONS

The present disclosure claims priority to U.S. Provisional Patent Application Ser. No. 62/858,667, filed Jun. 7, 2019, and U.S. Provisional Patent Application Ser. No. 62/870,152 filed Jul. 3, 2019, both of which are incorporated by reference herein in their entirety.

FIELD OF DISCLOSURE

The present disclosure relates in general to circuits for electronic devices, including without limitation personal audio devices such as wireless telephones and media players, and more specifically, to providing low-latency compensating audio filters using negative group delay in order to optimize filtering of out-of-band noise from the audio output path.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

In many audio output systems, it is desirable to have low latency, wherein latency may be defined as a duration of time it takes a digital audio input signal to be processed and reproduced as audible sound by a transducer. An example of a scenario in which low latency is desired is noise cancellation using one or more microphones in a feedback or feed forward system. It is often desirable for such audio system to operate at a high dynamic range with low power. Many will be battery operated and operate under a wide range of audio levels.

Out-of-band noise (e.g., noise at ultrasonic frequencies) present within an audio signal may cause undesirable dissipation of power in drivers, amplifiers, and other components of an audio system. Out-of-band noise may also spectrally fold into the audible audio band, leading to undesirable noise. Accordingly, to maximize dynamic range and minimize power, it may be desirable to reduce or eliminate out-of-band noise from an audio signal using out-of-band filtering. However, out-of-band filtering may introduce undesirable delay into an audio path.

SUMMARY

In accordance with the teachings of the present disclosure, one or more disadvantages and problems associated with existing approaches to out-of-band noise filtering may be reduced or eliminated.

In accordance with embodiments of the present disclosure, a system may include an input configured to receive an audio signal, a filter having a negative group delay within a range of frequencies which are human-audible, the filter configured to receive the audio signal and filter the audio signal to generate a filtered audio signal, and a modulator configured to receive the filtered audio signal and modulate the filtered audio signal to generate a modulated filtered audio signal for communication over a digital interface.

In accordance with these and other embodiments of the present disclosure, a system may comprise a first detector and a second detector. The first detector may be configured to detect at a transmitting side of a digital interface, a sample of a modulated filtered audio signal generated from an input signal filtered by a first filter having a first filter response, determine whether the modulated filtered audio signal has a condition for operating the first filter in a first mode, generate a control signal to the first filter to operate in the first mode in response to a determination that the modulated filtered audio signal has the condition, and generate the control signal to the first filter to operate in a second mode in response to a determination that the modulated filtered audio signal is without the condition. The second detector may be configured to detect at a receiving side of the digital interface the sample of the modulated filtered audio signal, determine whether the modulated filtered audio signal has a condition for operating the first filter in the first mode, generate a control signal to a second filter having a second response that is an approximate inverse of the first response and configured to filter the modulated filtered audio signal filter, the control signal for causing the second filter to operate in a third mode in response to a determination that the modulated filtered audio signal has the condition, and generate the control signal to the second filter to operate in a fourth mode in response to a determination that the modulated filtered audio signal is without the condition.

In accordance with these and other embodiments of the present disclosure, a method may include receiving an audio signal, filtering the audio signal to generate a filtered audio signal with a filter having a negative group delay within a range of frequencies which are human-audible, and modulating the filtered audio signal to generate a modulated filtered audio signal for communication over a digital interface.

In accordance with these and other embodiments of the present disclosure, a method may comprise detecting at a transmitting side of a digital interface, a sample of a modulated filtered audio signal generated from an input signal filtered by a first filter having a first filter response, determining whether the modulated filtered audio signal has a condition for operating the first filter in a first mode, generating a control signal to the first filter to operate in the first mode in response to a determination that the modulated filtered audio signal has the condition, generating the control signal to the first filter to operate in a second mode in response to a determination that the modulated filtered audio signal is without the condition, detecting at a receiving side of the digital interface the sample of the modulated filtered audio signal, determining whether the modulated filtered audio signal has a condition for operating the first filter in the first mode, generating a control signal to a second filter having a second response that is an approximate inverse of the first response and configured to filter the modulated filtered audio signal filter, the control signal for causing the second filter to operate in a third mode in response to a determination that the modulated filtered audio signal has the condition, and generating the control signal to the second filter to operate in a fourth mode in response to a determination that the modulated filtered audio signal is without the condition.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
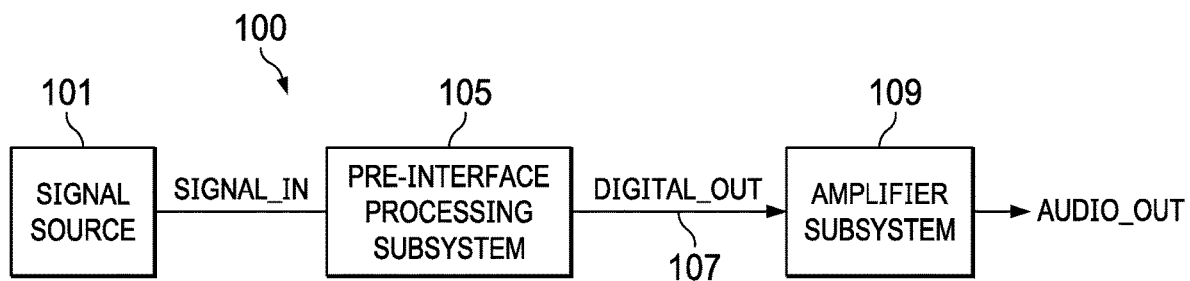
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include a signal source 101, a pre-interface processing subsystem 105, a digital interface 107, and an amplifier subsystem 109.

Figure 2:
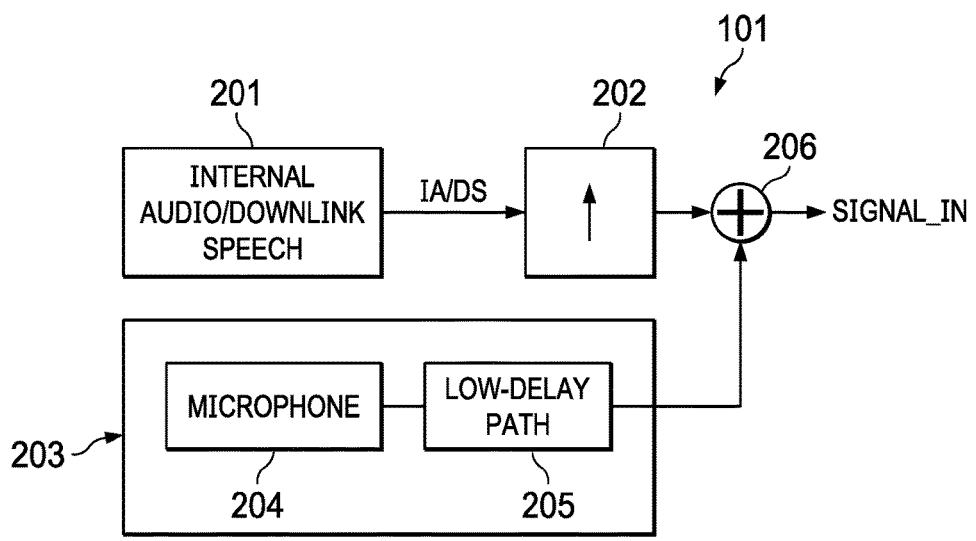
FIG. 2 illustrates a block diagram of selected components of an example signal source, in accordance with embodiments of the present disclosure.

Signal source 101 may comprise any system, device, or apparatus configured to generate a digital signal, for example digital input signal SIGNAL_IN. For example, in embodiments in which signal processing system 100 is an audio processing system, signal source 101 may comprise a digital microphone system. In addition or alternatively, signal source 101 may also include a source of playback audio (e.g., music, video soundtrack) and/or download speech. In some embodiments, signal source 101 may be a combination of audio sources, as shown in FIG. 2. As depicted in FIG. 2, signal source 101 may include an internal audio/downlink speech source 201, that may generate an audio signal IA/DS. In some embodiments, such audio signal IA/DS may be a 24-bit signal and/or may be sampled at 48 KHz. An interpolator 202 may upconvert audio signal IA/DS to a higher sampling frequency (e.g., 1.536 MHz). Signal source 101 may also include a microphone subsystem 203 having a microphone 204 and a low-delay path 205 that may convert an analog signal generated by microphone 204 into an equivalent digital signal. When the signal generated by microphone 204 is used in a feedforward or feedback processing application (e.g., noise cancellation), it may be desirable that audio processing of such signal be undertaken with minimum latency. Accordingly, such signal may be sampled at an over-sampled frequency (e.g., 1.536 MHz), in order to meet low-latency requirements of signal processing system 100. A combiner 206 may combine the upconverter signal from interpolator 202 and the signal from microphone subsystem 203 to generate digital input signal SIGNAL_IN.

Turning again to FIG. 1, pre-interface processing subsystem 105 may comprise any suitable system, device, or apparatus configured to process input signal SIGNAL_IN to generate a digital output signal DIGITAL_OUT and condition digital output signal DIGITAL_OUT for transmission over digital interface 107 to amplifier subsystem 109. In some embodiments, digital output signal DIGITAL_OUT may be encoded into a standard digital audio signal, such as Audio Engineering Society/European Broadcasting Union (AES/EBU), Sony/Philips Digital Interface Format (S/PDIF), or other suitable standard. Amplifier subsystem 109 may comprise any suitable system, device, or apparatus configured to process and condition (e.g., amplify) digital output signal DIGITAL_OUT in order to generate an audio output signal AUDIO_OUT, which is a reproduction of input signal SIGNAL_IN, to a transducer (e.g., a speaker). Example details of pre-interface processing subsystem 105 and amplifier subsystem 109 are shown in FIG. 3, which illustrates a block diagram of selected components of example pre-interface processing subsystem 105 and amplifier subsystem 109, in accordance with embodiments of the present disclosure.

Figure 3:
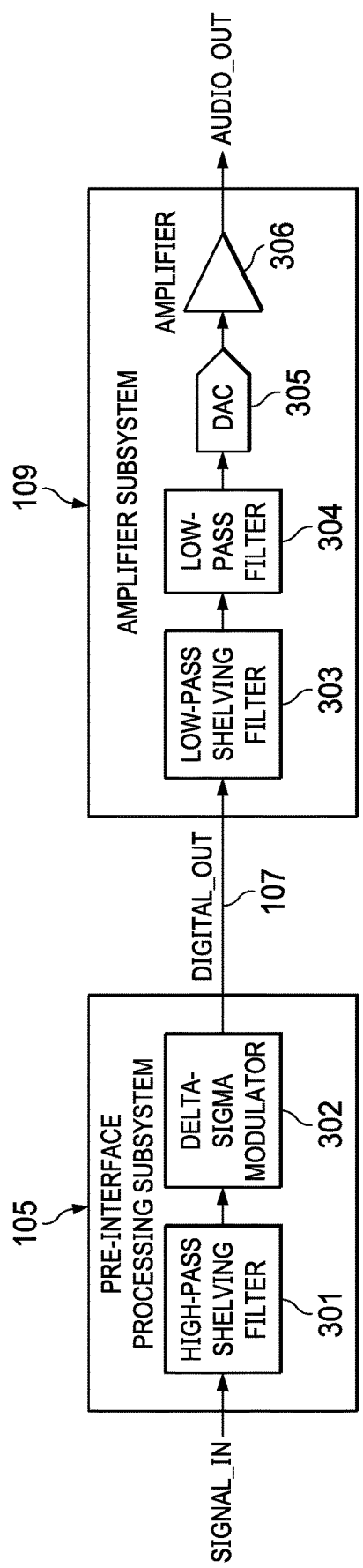
FIG. 3 illustrates a block diagram of selected components of an example pre-interface processing subsystem and an example amplifier subsystem, in accordance with embodiments of the present disclosure.
Figure 4:
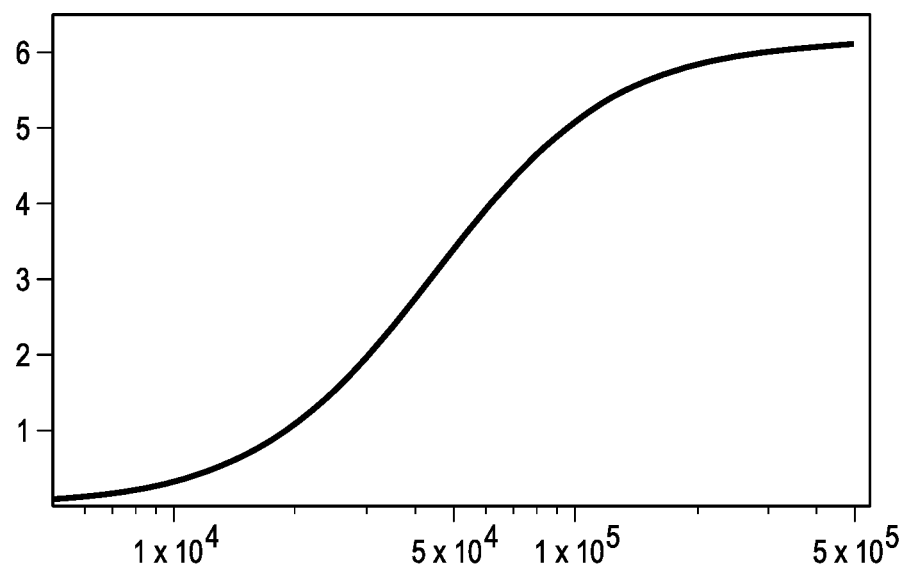
FIG. 4 illustrates a graph of an example transfer function for a high-pass shelving filter, in accordance with embodiments of the present disclosure.

As shown in FIG. 3, pre-interface processing subsystem 105 may include a high-pass shelving filter 301 configured to receive and high-pass filter input signal SIGNAL_IN. High-pass shelving filter 301 may comprise any suitable filter for applying higher signal gains to higher-frequency content of input signal SIGNAL_IN. For example, high-pass shelving filter 301 may have one real pole and one real zero. In some embodiments, high-pass shelving filter 301 may have a transfer function given by:

$$\frac{(1-az^{-1})(1-b)}{(1-bz^{-1})(1-a)}$$

wherein example values for a and b may comprise a=0.96 and b=0.92. Differing values of coefficients a and b may result in differing gains and/or corner frequencies. FIG. 4 depicts a graphical representation of the example transfer function given above as signal gain in decibels versus frequency. High-pass shelving filter 301 may also be referred to as a pre-emphasis filter and the processing of filtering with high-pass shelving filter 301 may be referred to as pre-emphasis.

As also shown in FIG. 3, pre-interface processing subsystem 105 may include a delta-sigma modulator 302 configured to modulate the resulting high-pass filtered signal into a modulated signal DIGITAL_OUT of lower resolution (e.g., a two-bit digital modulated signal sampled at 1.5

MHz), which may be appropriate for interfacing between two processing blocks (e.g., pre-interface processing subsystem 105 and amplifier subsystem 109). Delta-sigma modulator 302 may add noise to the signal, particularly in out-of-band frequencies (e.g., ultrasonic components of the signal outside of the audible frequency band).

As depicted in FIG. 3, amplifier subsystem 109 may receive modulated signal DIGITAL_OUT and apply a low-pass shelving filter 303, which may also be referred to as a de-emphasis filter, to modulated signal DIGITAL_OUT. In some embodiments, the transfer function of low-pass shelving filter 303 may be the inverse or near-inverse of the transfer function of high-pass shelving filter 301. For example, high-pass shelving filter 301 may have a transfer function given by:

$$\frac{(1-bz^{-1})(1-a)}{(1-az^{-1})(1-b)}$$

Figure 5:
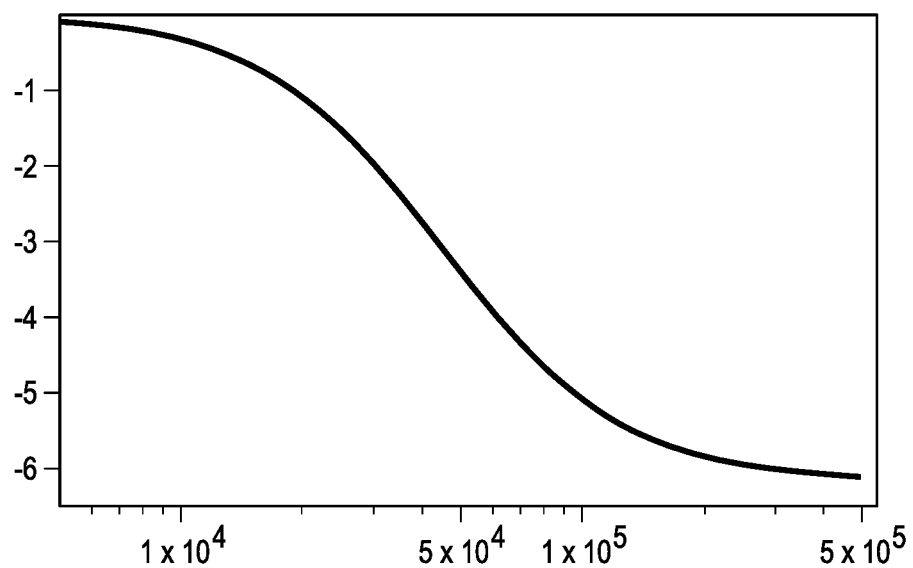
FIG. 5 illustrates a graph of an example transfer function for a low-pass shelving filter, in accordance with embodiments of the present disclosure.

FIG. 5 depicts a graphical representation of the example transfer function given above as signal gain in decibels versus frequency.

Amplifier subsystem 109 may also include a low-pass filter 304 which may further filter modulated signal DIGITAL_OUT. In some embodiments, low-pass filter 304 may also reduce a sample rate of modulated signal DIGITAL_OUT. In these and other embodiments, low-pass filter 304 may include a variable latency filter such as that described in U.S. Prov. Patent Application Ser. No. 62/858,667, U.S. Prov. Patent Application Ser. No. 62/870,152, and any and all patent applications deriving priority therefrom, and all of which are incorporated by reference herein in their entireties.

Although FIG. 3 depicts low-pass shelving filter 303 followed by low-pass filter 304, in some embodiments, low-pass filter 304 may be followed by low-pass shelving filter 303. In these and other embodiments, the functionality of low-pass shelving filter 303 and low-pass filter 304 may be combined into a single filter.

Amplifier subsystem 109 may also include a digital-to-analog converter 305 configured to convert modulated signal DIGITAL_OUT, as filtered by low-pass shelving filter 303 and low-pass filter 304, into an equivalent analog signal. An amplifier 306 of amplifier subsystem 109 may amplify such equivalent analog signal in order to drive audio output signal AUDIO_OUT to an audio transducer.

Advantageously, the systems and methods described above may provide for noise filtering without added delay, as high-pass shelving filter 301 may have a negative group delay for audio-band frequencies that cancels a positive group delay for audio-band frequencies of low-pass shelving filter 303. Thus, the use of pre-emphasis prior to digital interface 107 and de-emphasis after digital interface 107 may enable for low-latency operation simultaneously with low-power and low-noise operation of signal processing system 100.

Although particular pre-emphasis and de-emphasis filters are depicted above, any suitable pre-emphasis and de-emphasis filters may be used in accordance with embodiments of the present disclosure. In many embodiments, the pre-emphasis filter will be an inverse or approximate inverse of the de-emphasis filter. In these and other embodiments, one or both of the pre-emphasis and de-emphasis filters may comprise a second-order or higher-order filter. In these and other embodiments, filter coefficients may be chosen to provide desired gain functions and/or corner frequencies.

Figure 6:
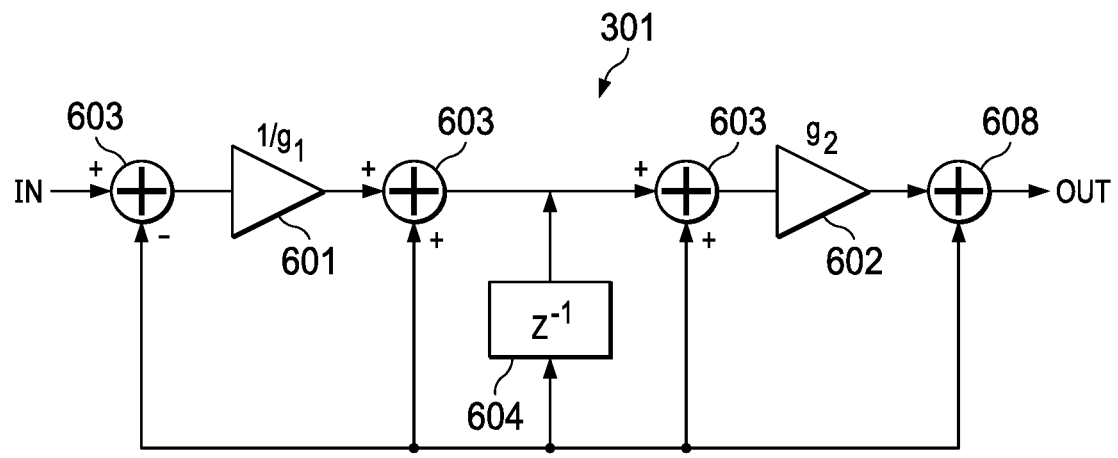
FIG. 6 illustrates a block diagram of selected functional components of an example high-pass shelving filter, in accordance with embodiments of the present disclosure.
Figure 7:
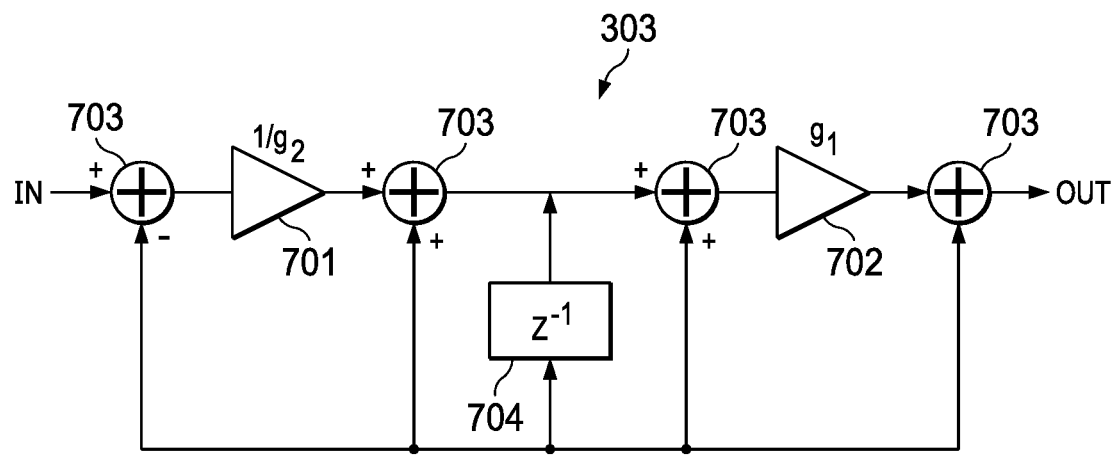
FIG. 7 illustrates a block diagram of selected functional components of an example low-pass shelving filter, in accordance with embodiments of the present disclosure.

While it is sometimes desirable to provide pre-emphasis to a signal prior to a noisy operation, pre-emphasis may reduce the highest maximum signal available without overloading the signal. Such potential issue may be minimized or eliminated by turning pre-emphasis and de-emphasis filters off as needed (e.g., emphasis enabled for signals below a threshold magnitude and disabled for signals above the threshold magnitude). However, using known approaches, such enabling and disabling of filters may lead to audible audio artifacts (e.g., pops, clicks, glitches, etc.) appearing in the signal. FIGS. 6 and 7 depict example pre-emphasis and de-emphasis filters that may be used to allow for dynamic enabling of emphasis without audible audio artifacts.

FIG. 6 illustrates a block diagram of selected functional components of high-pass shelving (pre-emphasis) filter 301, in accordance with embodiments of the present disclosure. As shown in FIG. 6, high-pass shelving (pre-emphasis) filter 301 may include gain element 601 with gain $1/g_1$, gain element 602 with gain $g_2$, signal combiners 603, and a delay element 604 which may be arranged as depicted, such that a transfer function of high-pass shelving (pre-emphasis) filter 301 may be given as:

$$\frac{g_2\left(1-\frac{g_2-1}{g_2}z^{-1}\right)}{g_1\left(1-\frac{g_1-1}{g_1}z^{-1}\right)}$$

FIG. 7 illustrates a block diagram of selected functional components of low-pass shelving (de-emphasis) filter 303, in accordance with embodiments of the present disclosure. As shown in FIG. 7, low-pass shelving (de-emphasis) filter 303 may include gain element 701 with gain $1/g_2$, gain element 702 with gain $g_1$, signal combiners 703, and a delay element 704 which may be arranged as depicted, such that a transfer function of low-pass shelving (de-emphasis) filter 303 may be given as:

$$\frac{g_1\left(1-\frac{g_1-1}{g_1}z^{-1}\right)}{g_2\left(1-\frac{g_2-1}{g_2}z^{-1}\right)}$$

Notably, the transfer function of high-pass shelving (pre-emphasis) filter 301 may be the inverse of the transfer function of low-pass shelving (de-emphasis) filter 303.

In operation, one or both of gains $g_1$ and $g_2$ may be variable based on a magnitude of input signal SIGNAL_IN. For example, in particular embodiments, when no emphasis is desired (e.g., signal magnitude above a threshold), gains $g_1$ and $g_2$ may be set to the same value (e.g., 64); however, when emphasis is desired (e.g., signal magnitude below the threshold), gain $g_2$ may be set to a value significantly larger than gain $g_1$ (e.g., $g_1=64$, $g_2=128$).

Figure 8:
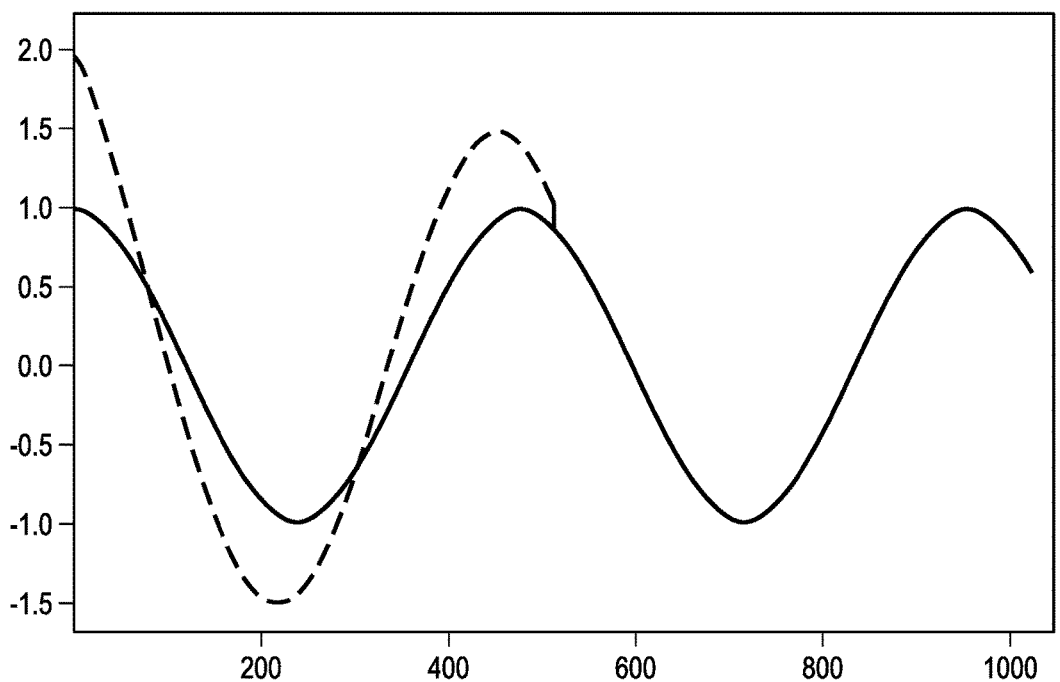
FIG. 8 illustrates an example graph of signal gains when filter emphasis is enabled and disabled, in accordance with embodiments of the present disclosure.

FIG. 8 illustrates an example graph of signal gains when filter emphasis is enabled and disabled, in accordance with embodiments of the present disclosure. The dashed curve depicts emphasis enabled in high-pass shelving filter 301 and low-pass shelving filter 303, and the solid curve shows emphasis disabled.

Figure 9:
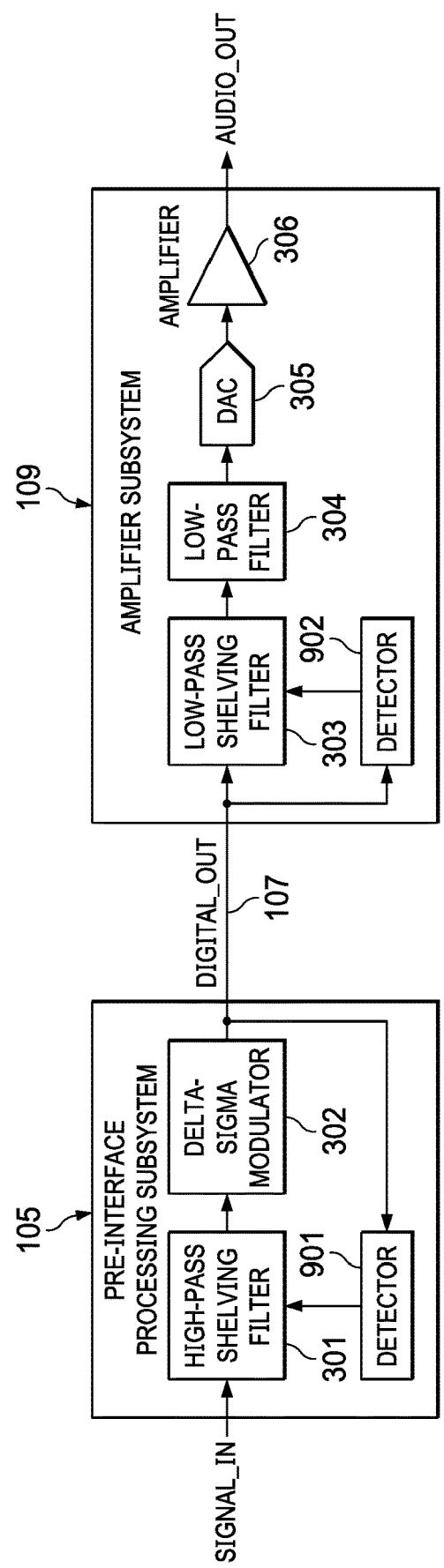
FIG. 9 illustrates a block diagram of selected components of an example pre-interface processing subsystem and an example amplifier subsystem with selectable gain settings, in accordance with embodiments of the present disclosure.

FIG. 9 illustrates a block diagram of selected components of an example pre-interface processing subsystem and an example amplifier subsystem with selectable gain settings, in accordance with embodiments of the present disclosure. As shown in FIG. 9, pre-interface processing subsystem 105 may include a detector 901 and amplifier subsystem 109 may include a detector 902. Detector 901 may be configured to sense modulated signal DIGITAL_OUT, determine whether a condition for applying emphasis exists (e.g., a magnitude of modulated signal DIGITAL_OUT being below threshold magnitude), and based on such determination, outputting one or more control signals for selectively enabling and disabling emphasis within high-pass shelving filter 301. Similarly, detector 902 may be configured to sense modulated signal DIGITAL_OUT, determine whether a condition for applying emphasis exists (e.g., a magnitude of modulated signal DIGITAL_OUT being below threshold magnitude), and based on such determination, outputting one or more control signals for selectively enabling and disabling emphasis within low-pass shelving filter 303. Because detectors 901 and 902 both use the same signal, modulated signal DIGITAL_OUT, to indicate a condition for applying emphasis, the switching of high-pass shelving filter 301 and low-pass shelving filter 303 between applying emphasis and not applying emphasis may be synchronized without a need for additional signaling. In addition, although not shown in FIG. 9, each of the control signal path between detector 901 and high-pass shelving filter 301 and the control signal path between detector 902 and low-pass shelving filter 303 may have signal delay elements, and such signal delay elements may be configured to provide for approximately identical delays in both control signal paths in order to provide for more accurate switching synchronization.

Figure 10:
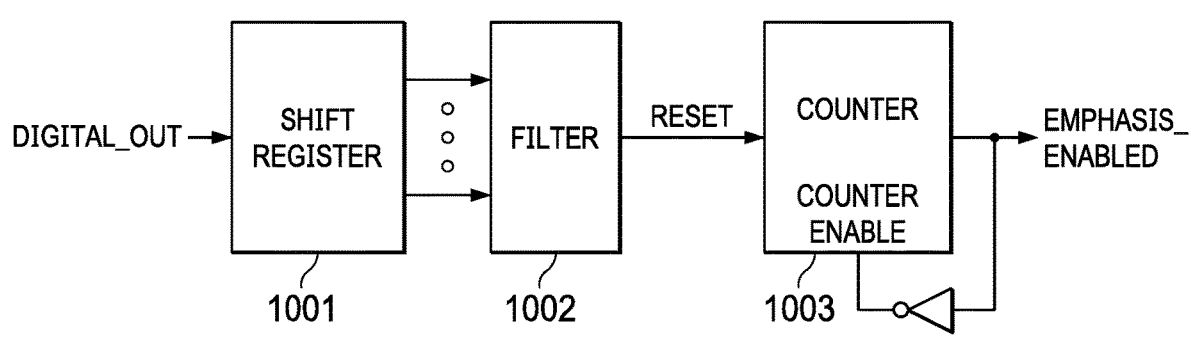
FIG. 10 illustrates a block diagram of selected components of an example detector, in accordance with embodiments of the present disclosure.

FIG. 10 illustrates a block diagram of selected components of an example detector 1000, in accordance with embodiments of the present disclosure. Instances of detector 1000 may be used to implement either or both of detector 901 and 902. As shown in FIG. 10, detector 1000 may include a shift register 1001, a filter 1002, and a counter 1003. Shift register 1001 may receive modulated signal DIGITAL_OUT and reconstruct a demodulated equivalent over an appropriate number of samples of modulated signal DIGITAL_OUT. Filter 1002 may include any suitable low-pass filter (e.g., a finite impulse response low-pass filter) configured to filter the demodulated equivalent. When the output of filter 1002 exceeds a threshold magnitude, it may generate a control signal to counter 1003 to reset counter 1003 (e.g., to zero). Counter 1003 may be configured to periodically increment itself (e.g., in accordance with a clock signal not explicitly shown in FIG. 10) until it reaches a limit (indicating that modulated signal DIGITAL_OUT is low in magnitude). Below the limit, counter 1003 may output a control signal EMPHASIS_ENABLE to disable emphasis. At the limit, counter 1003 may output control signal EMPHASIS_ENABLE to enable emphasis and cease counting until counter 1003 is again reset by filter 1002.

Using the systems and methods disclosed herein, out-of-band noise of an audio signal may be reduced or eliminated while maintaining little or no latency in the audio signal path. For example, low-pass shelving filter 303 and/or low-pass filter 304 may remove high-frequency out-of-band components from an audio signal, while high-pass shelving filter 301 may introduce a negative group delay for audio-band frequencies which reduces or eliminates the positive group delay for audio-band frequencies introduced by low-pass shelving filter 303 and/or low-pass filter 304.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system, comprising:
   an input configured to receive an audio signal;
   a filter having a negative group delay within a range of frequencies which are human-audible, the filter configured to receive the audio signal and filter the audio signal to generate a filtered audio signal; and a modulator configured to receive the filtered audio signal and modulate the filtered audio signal to generate a modulated filtered audio signal for communication over a digital interface.

2. The system of claim 1, wherein the filter comprises a high-pass shelving filter.

3. The system of claim 1, further comprising an amplifier subsystem having:

a second input configured to receive the modulated filtered audio signal via the digital interface;

a second filter having a positive group delay within the range of frequencies, the second filter configured to receive the modulated filtered audio signal and filter the modulated filtered audio signal to generate a compensated audio signal;

a digital-to-analog converter configured to generate an analog equivalent signal of the compensated audio signal; and an amplifier configured to amplify the analog equivalent signal to drive an audio output signal to a transducer.

4. The system of claim 3, wherein:

the filter has a first filter response; and the second filter has a second filter response which is approximately inverse to the first filter response.

5. The system of claim 4, wherein:

the first filter response is configurable to apply a first gain in an emphasis mode of the filter and a second gain in a normal mode of the filter; and the second filter response is configurable to remain approximately inverse to the first filter response when the filter is switched between the emphasis mode and the normal mode.

6. The system of claim 5, further comprising a control circuit configured to:

detect the modulated filtered audio signal;

determine whether the modulated filtered audio signal has a condition for operating the filter in the emphasis mode;

generate a control signal to the filter to apply the first gain in response to a determination that the modulated filtered audio signal has the condition; and generate the control signal to the filter to apply the second gain in response to a determination that the modulated filtered audio signal is without the condition.

7. The system of claim 6, wherein the condition is a magnitude of the modulated filtered audio signal.

8. The system of claim 3, wherein:

the filter comprises a high-pass shelving filter; and the second filter comprises a low-pass shelving filter.

9. A system comprising:

a first detector configured to:

detect at a transmitting side of a digital interface, a sample of a modulated filtered audio signal generated from an input signal filtered by a first filter having a first filter response;

determine whether the modulated filtered audio signal has a condition for operating the first filter in a first mode;

generate a control signal to the first filter to operate in the first mode in response to a determination that the modulated filtered audio signal has the condition; and generate the control signal to the first filter to operate in a second mode in response to a determination that the modulated filtered audio signal is without the condition; and a second detector configured to:

detect at a receiving side of the digital interface the sample of the modulated filtered audio signal;

determine whether the modulated filtered audio signal has a condition for operating the first filter in the first mode;

generate a control signal to a second filter having a second response that is an approximate inverse of the first response and configured to filter the modulated filtered audio signal filter, the control signal for causing the second filter to operate in a third mode in response to a determination that the modulated filtered audio signal has the condition; and generate the control signal to the second filter to operate in a fourth mode in response to a determination that the modulated filtered audio signal is without the condition.

10. The system of claim 9, wherein the condition is a magnitude of the modulated filtered audio signal.

11. The system of claim 9, wherein the first filter is a high-pass shelving filter and the second filter is a low-pass shelving filter.

12. The system of claim 9, wherein:

each of the first filter response and second filter response is configurable;

the first filter response is a first transfer function in the first mode;

the first filter response is a second transfer function in the second mode;

the second filter response is a third transfer function in the third mode; and the second filter response is a fourth transfer function in the fourth mode.

13. A method, comprising:

receiving an audio signal;

filtering the audio signal to generate a filtered audio signal with a filter having a negative group delay within a range of frequencies which are human-audible; and modulating the filtered audio signal to generate a modulated filtered audio signal for communication over a digital interface.

14. The method of claim 13, wherein the filter comprises a high-pass shelving filter.

15. The method of claim 13, further comprising:

receiving, at an amplifier subsystem, the modulated filtered audio signal via the digital interface;

filtering the modulated filtered audio signal to generate a compensated audio signal with a second filter of the amplifier subsystem, the second filter having a positive group delay within the range of frequencies;

generating an analog equivalent signal of the compensated audio signal; and amplifying, with an amplifier of the amplifier subsystem, the analog equivalent signal to drive an audio output signal to a transducer.

16. The method of claim 15, wherein:

the filter has a first filter response; and the second filter has a second filter response which is approximately inverse to the first filter response.

17. The method of claim 16, wherein:

the first filter response is configurable to apply a first gain in an emphasis mode of the filter and a second gain in a normal mode of the filter; and the second filter response is configurable to remain approximately inverse to the first filter response when the filter is switched between the emphasis mode and the normal mode.

18. The method of claim 17, further comprising:
detecting the modulated filtered audio signal;
determining whether the modulated filtered audio signal has a condition for operating the filter in the emphasis mode;
generating a control signal to the filter to apply the first gain in response to a determination that the modulated filtered audio signal has the condition; and
generating the control signal to the filter to apply the second gain in response to a determination that the modulated filtered audio signal is without the condition.

19. The method of claim 18, wherein the condition is a magnitude of the modulated filtered audio signal.

20. The method of claim 15, wherein:
the filter comprises a high-pass shelving filter; and
the second filter comprises a low-pass shelving filter.

21. A method comprising:
detecting at a transmitting side of a digital interface, a sample of a modulated filtered audio signal generated from an input signal filtered by a first filter having a first filter response;
determining whether the modulated filtered audio signal has a condition for operating the first filter in a first mode;
generating a control signal to the first filter to operate in the first mode in response to a determination that the modulated filtered audio signal has the condition;
generating the control signal to the first filter to operate in a second mode in response to a determination that the modulated filtered audio signal is without the condition;
detecting at a receiving side of the digital interface the sample of the modulated filtered audio signal;
determining whether the modulated filtered audio signal has a condition for operating the first filter in the first mode;
generating a control signal to a second filter having a second response that is an approximate inverse of the first response and configured to filter the modulated filtered audio signal filter, the control signal for causing the second filter to operate in a third mode in response to a determination that the modulated filtered audio signal has the condition; and
generating the control signal to the second filter to operate in a fourth mode in response to a determination that the modulated filtered audio signal is without the condition.

22. The method of claim 21, wherein the condition is a magnitude of the modulated filtered audio signal.

23. The method of claim 21, wherein the first filter is a high-pass shelving filter and the second filter is a low-pass shelving filter.

24. The method of claim 21, wherein:
each of the first filter response and second filter response is configurable;
the first filter response is a first transfer function in the first mode;
the first filter response is a second transfer function in the second mode;
the second filter response is a third transfer function in the third mode; and
the second filter response is a fourth transfer function in the fourth mode.

* * * * *